(12) United States Patent
Yui

(10) Patent No.: US 10,392,724 B2
(45) Date of Patent: Aug. 27, 2019

(54) PROCESS OF FORMING EPITAXIAL WAFER

(71) Applicant: SUMITOMO ELECTRIC INDUSTRIES, LTD., Osaka (JP)

(72) Inventor: Keiichi Yui, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/935,726

(22) Filed: Mar. 26, 2018

(65) Prior Publication Data

US 2018/0274126 A1 Sep. 27, 2018

(30) Foreign Application Priority Data

Mar. 24, 2017 (JP) ................. 2017-059713

(51) Int. Cl.

| | |
|---|---|
| C30B 25/16 | (2006.01) |
| H01L 21/02 | (2006.01) |
| H01L 29/205 | (2006.01) |
| H01L 29/778 | (2006.01) |
| H01L 29/66 | (2006.01) |
| C30B 29/40 | (2006.01) |
| H01L 29/20 | (2006.01) |
| H01L 29/417 | (2006.01) |

(52) U.S. Cl.
CPC .......... *C30B 25/165* (2013.01); *C30B 29/403* (2013.01); *C30B 29/406* (2013.01); *H01L 21/0254* (2013.01); *H01L 21/0262* (2013.01); *H01L 21/02378* (2013.01); *H01L 21/02458* (2013.01); *H01L 21/02513* (2013.01); *H01L 29/205* (2013.01); *H01L 29/66462* (2013.01); *H01L 29/7787* (2013.01); *H01L 21/0242* (2013.01); *H01L 21/02381* (2013.01); *H01L 21/02505* (2013.01); *H01L 29/2003* (2013.01); *H01L 29/41766* (2013.01)

(58) Field of Classification Search
CPC combination set(s) only.
See application file for complete search history.

(56) References Cited

U.S. PATENT DOCUMENTS

| | | | |
|---|---|---|---|
| 2003/0232457 A1* | 12/2003 | Kawaguchi | ............. C30B 25/02 438/46 |
| 2008/0237610 A1 | 10/2008 | Imanishi et al. | |
| 2013/0187172 A1 | 7/2013 | Tanaka et al. | |

FOREIGN PATENT DOCUMENTS

| | | |
|---|---|---|
| JP | 2008-251966 | 10/2008 |
| JP | 2013-175696 | 9/2013 |

* cited by examiner

*Primary Examiner* — Erin F Bergner
(74) *Attorney, Agent, or Firm* — Smith, Gambrell & Russell, LLP

(57) ABSTRACT

A process of forming an epitaxial wafer is disclosed. The process includes steps of (a) growing an aluminum nitride (AlN) layer at a first temperature and a first flow rate of ammonia ($NH_3$); and (b) growing a gallium nitride (GaN) layer on the AlN layer. The step (b) includes a first period and a second period. At least one of a temperature from the first temperature to a second temperature that is lower than the first temperature and a flow rate of $NH_3$ from the first flow rate to a second flow rate different from the first flow rate is carried out during the first period. The second period grows the GaN layer at the second temperature and the second flow rate of $NH_3$.

13 Claims, 11 Drawing Sheets

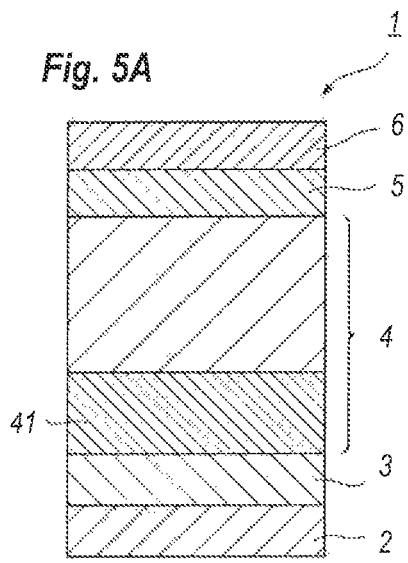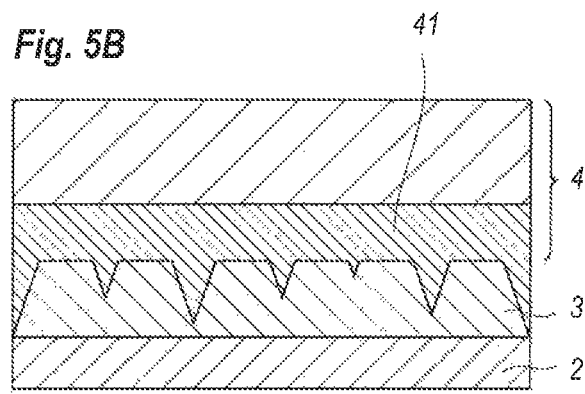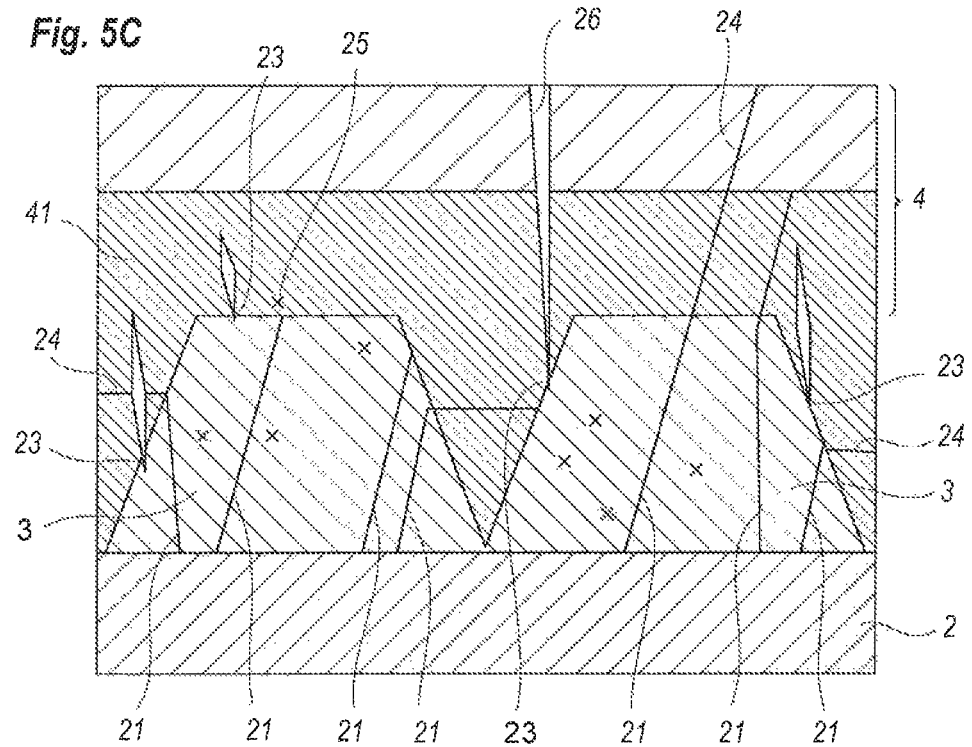

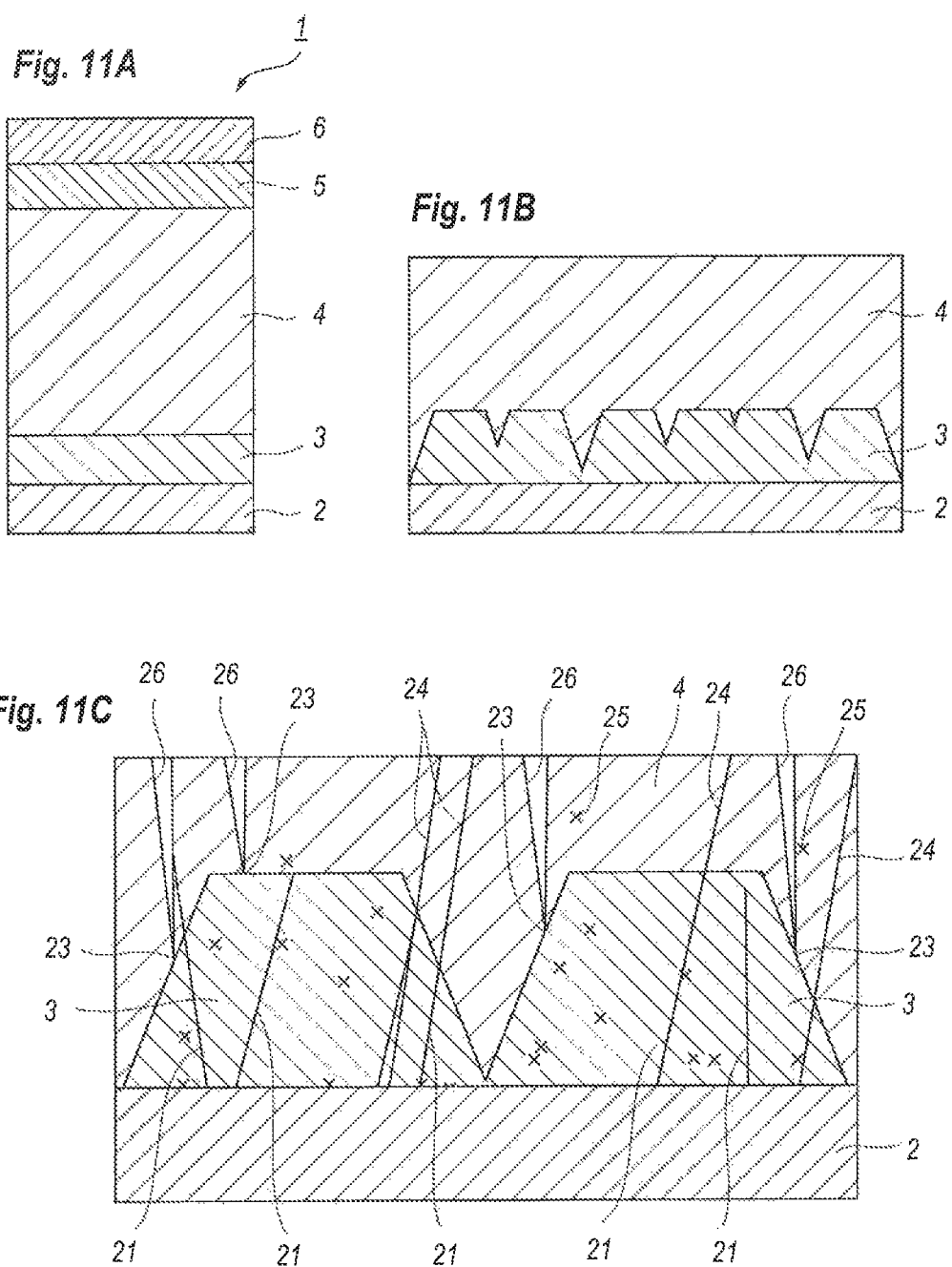

PROCESS OF FORMING EPITAXIAL WAFER

CROSS REFERENCE TO RELATED APPLICATION

This application claims the benefit under 35 USC § 119(a) of Japanese Patent Application No. 2017-059713, filed on Mar. 24, 2017, the entire disclosure of which is incorporated herein by reference for all purposes.

BACKGROUND OF INVENTION

1. Field of Invention

The present invention relates to a process of epitaxially growing a nitride semiconductor layer.

2. Background Arts

Japanese Patent Applications laid open No. JP-2013-175696A and JP-2008-251966A have disclosed high electron mobility transistors (HEMTs) having an aluminum nitride (AlN) layer and a gallium nitride (GaN) layer on a silicon carbide (SiC) substrate. The former document has disclosed a process sequentially growing an AlN layer and a GaN layer by steps of first supplying ammonia ($NH_3$) and tri-methyl-aluminum (TMA) at 1175° C. for growing the AlN layer, then, cooling down a temperature of a substrate to 1000° C. under atmosphere of nitrogen ($N_2$) mixed with ammonia ($NH_3$), and finally growing a GaN layer with a thickness of 480 nm by supplying ammonia ($NH_3$) and tri-methyl-gallium (TMG). The latter document has disclosed another technique for first growing an AlN layer at a temperature of 1100 to 1200° C., then lowering a temperature of the substrate to 1050±50° C. suspending supply of TMA but varying a flow rate of ammonia ($NH_3$), then growing a GaN layer with a thickness of 2 μm by supplying TMG.

A semiconductor device primary made of nitride semiconductor materials, in particular, made of gallium nitride (GaN), such as HEMT, has been popular in the field. In such a semiconductor device, a semiconductor layer of GaN system is generally grown on a substrate made of material not contained within the GaN system, such as SiC. Because a GaN layer is hard, or almost impossible to grow directly on a substrate outside of the GaN system, an additional layer, such as aluminum nitride (AlN), is often grown on a substrate as a buffer layer; then, a GaN layer is grown on the AlN layer. The documents above have disclosed technique to grown a GaN layer on an AlN layer.

A thickened AlN layer often degrades crystal quality thereof; accordingly, an AlN layer is preferable grown as thin as possible, for instance, thinner than 50 nm. However, such a thinned AlN layer thinner than 50 nm is grown in islands, not in a laminate layer. Growing a GaN layer on such island of AlN layer that has lattice constant different from that of GaN, an interface between the AlN layer and the GaN layer induces many defects. Besides, depending on growth conditions of the GaN layer, the grown GaN layer in a surface thereof induces pits and dislocations derived from island structures of the AlN layer. A semiconductor device formed on such a degraded surface inevitably deteriorates in reliability thereof and degrades performances.

Also, the GaN layer is preferably thinner to enhance performances of the device, in particular. For instance, a HEMT having a thinner GaN layer as a carrier traveling layer may enhance pulse response because a thinner GaN layer may decrease a total count of traps contained in the GaN layer, which may reduce capture and de-capture possibility of carries by the traps in the GaN layer. However, a thinned GaN layer also induces a number of pits appearing in the surface thereof. Because a GaN layer is grown as compensating pits, a thickened GaN layer may decrease the number of pits appearing in the surface. For instance, a GaN layer thinner than 0.5 μm is hard to compensate the pits.

SUMMARY OF INVENTION

An aspect of the present invention relates to a process of forming an epitaxial wafer. The process includes a step of growing an aluminum nitride (AlN) layer at a first temperature and a first flow rate of ammonia ($NH_3$); and a step of growing a gallium nitride (GaN) layer on the AlN layer. The latter step of growing the GaN layer includes a first period and a second period. A feature of the process according to the present invention is that at least one of a temperature from the first temperature to a second temperature that is lower than the first temperature and a flow rate of $NH_3$ from the first flow rate to a second flow rate different from the first flow rate is carried out during the first period. The second period grows the GaN layer at the second temperature and the second flow rate of $NH_3$.

BRIEF DESCRIPTION OF THE DRAWINGS

The invention will now be described by way of example only with reference to the accompanying drawings in which:

FIG. 4E shows a cross section of the transistor at a step of the process;

FIG. 5A schematically illustrates structures of the epitaxial wafer formed by the process according to the present invention; FIG. 5B magnifies the interface between the AlN layer and the GaN layer; and FIG. 5C further magnifies the interface;

FIG. 11A schematically illustrates a cross section of semiconductor layers grown by the conventional process, FIG. 11B magnifies the AlN layer and the GaN layer shown in FIG. 11A, and FIG. 11C further magnifies the AlN layer and the GaN layer.

DESCRIPTION OF EMBODIMENTS

Next, some embodiments according to the present invention will be described as referring to accompanying drawings. The present invention is not restricted to those embodiments, and has a scope defined in claims and includes all modifications and equivalent thereto. Also, in the description of the drawings, numerals and symbols same with or similar to each other will refer to elements same with or similar to each other without overlapping explanations.

Figure 10:
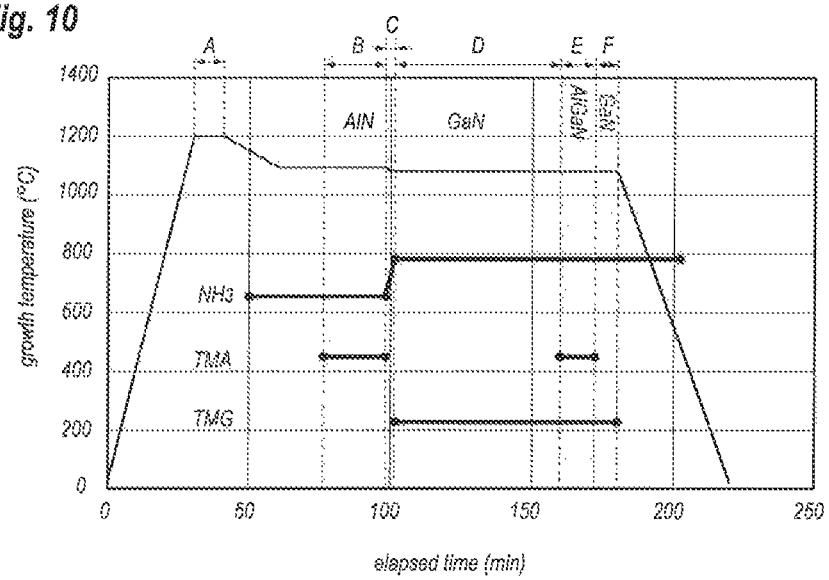
FIG. 10 shows a conventional sequence of a temperature and a timing for supplying source gases for growing epitaxial wafer for a nitride semiconductor device.

FIG. 10 shows a conventional sequence of a temperature and a timing of supplying source gases for growing epitaxial wafer for a nitride semiconductor device. In the conventional sequence shown in FIG. 10, a period C suspends supply of a gallium (Ga) source and a period D subsequent to the period C resumes the supply of the Ga source. Specifically, performing a heat treatment of a substrate 2 during a period A, then lowering a temperature in a chamber, a period B begins growth of an AlN layer 3 with a thickens of 20 nm by the MOCVD (Metal Organic Chemical Vapor Deposition) technique by supplying tri-methyl-aluminum (TMA) and ammonia ($NH_3$) with a flow rate of 0.5 mol/min as source gases for aluminum (Al) and nitrogen (N) under a pressure in the growth chamber of 13.3 kPa and a temperature of 1100° C. The period C subsequent to the period B suspends the supply of TMA as keeping the supply of $NH_3$ by a flow rate of 0.5 mol/min at the pressure of 13.3 kPa, and lowers the temperature in the growth chamber to 1080° C. that is a temperature for growing a GaN layer 4. Then, the period D resumes the supply of tri-methyl-gallium (TMG) as a source gas for gallium (Ga) by a flow rate of 120 μmol/min to grow the GaN layer 4 with a thickness of 1000 nm on the AlN layer 3 by a growth rate of 0.4 nm/sec.

FIG. 11A schematically illustrates a cross section of semiconductor layers grown by the conventional process above described; FIG. 11B magnifies the AlN layer 3 and the GaN layer 4 on the AlN layer 3 shown in FIG. 11A; and FIG. 11C further magnifies an interface between the AlN layer 3 and the GaN layer 4. When the AlN layer 3 in a thickness thereof is relatively thin, for instance around 20 nm, the AlN layer 3 is grown in island structures not forming a layered structure as shown in FIG. 11B. Accordingly, the AlN layer 3 is often called as a nucleus forming layer. Growing a GaN layer on thus configured AlN layer 3 by a conventional sequence, where GaN has a lattice constant different from that of AlN, an interface between two layers often causes defects 23 and/or dislocations 24 as shown in FIG. 11C. This is due to inducement of abnormality between surface conditions of the AlN layer 3 and an aspect ratio, which means a ratio in growth rates parallel and perpendicular to the AlN layer, of the GaN layer. Besides, dislocation 24 derived from dislocations 21 in the AlN layer 3 are likely induced in the GaN layer 4, which results in pits 26 appearing in a surface of the GaN layer 4, which results in increased leak currents intermediary the pits.

Also, an epitaxially grown AlN layer 3 inherently shows various surface orientations and a GaN layer 4 grown thereon is likely to succeed those surface orientations. Although growth rates of a GaN layer depend on surface orientations, one surface orientation with a maximum growth rate practically dominantly appears in a grown GaN layer. Accordingly, in order to remove the pits in the surface of a GaN layer, a considerable thickness is required.

Embodiment

Figure 1:
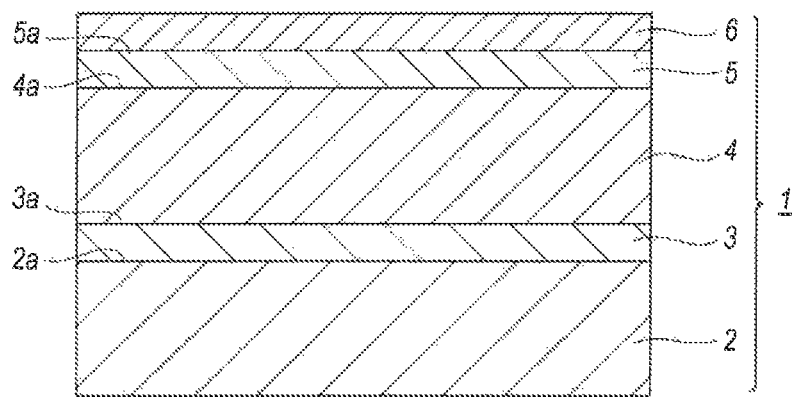
FIG. 1 shows a cross section of an epitaxial wafer formed by a process according to an embodiment of the present invention.

FIG. 1 shows a cross section of an epitaxial wafer according to an embodiment of the present invention. The epitaxial wafer 1 includes a substrate 2, an AlN layer 3, a GaN layer 4, an electron supply layer 5, and a cap layer 6, where the layers, 3 to 6, are stacked on the substrate 2 in this order. An epitaxial wafer 1 is unnecessary to always include the electron supply layer 5 and the cap layer 6. The substrate 2, which is provided for an epitaxial growth, may be made of material or materials different from nitride semiconductor materials. For instance, the substrate 2 may be made of silicon (Si), silicon carbide (SiC), sapphire ($Al_2O_3$), and so on. The present embodiment provides the substrate 2 made of SiC. The substrate 2 in a top surface 2a thereof on which the AlN layer 3 is to be in contact therewith is unnecessary to have a unique surface orientation.

The AlN layer 3, which is epitaxially grown on the top surface 2a of the substrate 2, has a thickness greater than 8 nm but thinner than 50 nm. The present embodiment of the AlN layer 3 has a thickness of around 20 nm. The AlN layer 3 may be operable as a buffer layer, or a seed layer for growing layers thereon.

The GaN layer 4, which is grown on a top surface 3a of the AlN layer 3, has a thickness of greater than 100 nm but thinner than 2000 nm. The present embodiment provides the GaN layer 4 with a thickness around 400 nm. According to a process for growing the GaN layer 4 described below, even such a thinner GaN layer 4 may decrease pits induced in a surface 4a thereof, where the pit density becomes, for instance, smaller than $10/cm^2$. The GaN layer 4 may be an un-doped layer not intentionally doped with any impurities.

The electron supply layer 5, which is grown on the top surface 4a of the GaN layer, has a thickness greater than 7 nm but thinner than 30 nm. The embodiment has a thickness of the electron supply layer around 20 nm. The electron supply layer 5 may be made of nitride semiconductor material such as AlGaN, InAlN, InAlGaN, and so on. The present embodiment has the electron supply layer 5 made of AlGaN. The AlGaN layer for the electron supply layer 5 may have n-type conduction. The cap layer 6, which is grown on a top surface 5a of the electron supply layer 5, preferably has a thickness of greater than 1 nm but thinner than 10 nm. The embodiment has the thickness around 5 nm. The cap layer 5 may be made of GaN and show the n-type conduction. The GaN cap layer 5 may show an intrinsic characteristic.

Figure 2:
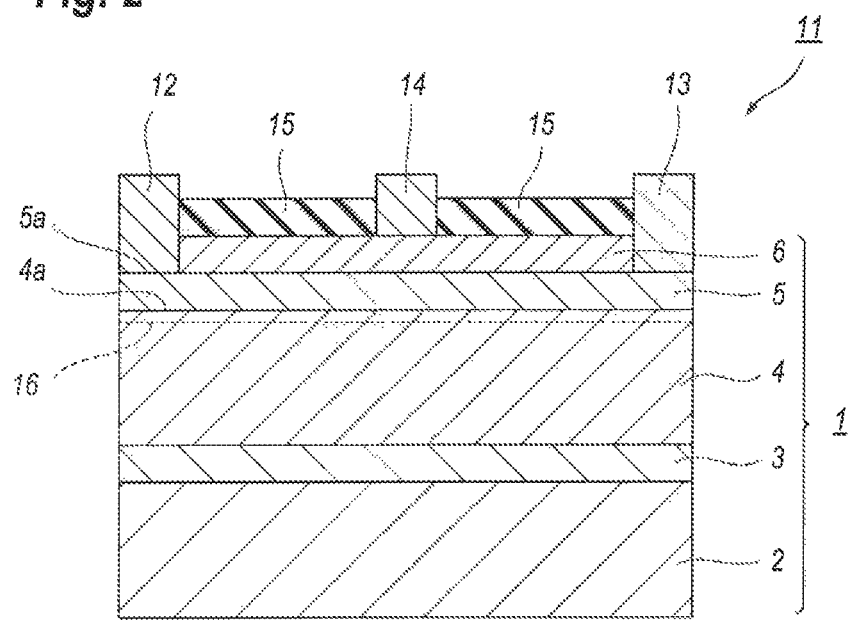
FIG. 2 shows a cross section of a transistor formed on the epitaxial wafer shown in FIG. 1.

FIG. 2 shows a cross section of a transistor 11 formed on the epitaxial wafer 1 shown in FIG. 1. The transistor 11 may have a type of High Electron Mobility Transistor (HEMT) providing a source electrode 12, a drain electrode 13, each on the electron supply layer 5 and a gate electrode 14 on the cap layer 6. The electron supply layer 5 and the GaN layer 4 in an interface therebetween, exactly, in a side of the GaN layer 4 at the interface therebetween, induces two-electron gas (2DEG) that becomes a channel 16 of the HEMT.

The source and drain electrodes, 12 and 13, are provided on the electron supply layer 5 in portions where the cap layer 6 is removed. The source and drain electrodes, 12 and 13, show non-rectifying characteristic against the electron supply layer 5. The source and drain electrodes, 12 and 13, are formed by alloying stacked metals of titanium (Ti) and aluminum (Al), where the former metal layer (Ti) is in contact with the electron supply layer 5 before alloying. The source and drain electrodes, 12 and 13, may be formed from a metal stack including additional titanium (Ti) on a top thereof. That is, the source and the drain electrodes, 12 and 13, may be formed by allowing a stacked metal of Ti/Al/Ti. The gate electrode 14 may be formed by a metal stack including nickel (Ni) and gold (au), where Ni is in contact with the cap layer 6. In an alternative, the gate electrode 14 may be provided on the electron supply layer 5 by removing the cap layer, or by forming an opening exposing the surface 5a of the electron supply layer 5. The passivation film 15 covers the cap layer 6 exposed between the electrodes, 13 and 14, and the gate electrode 14. The passivation film 15 may be made of, for instance, silicon nitride (SiN).

Figure 3:
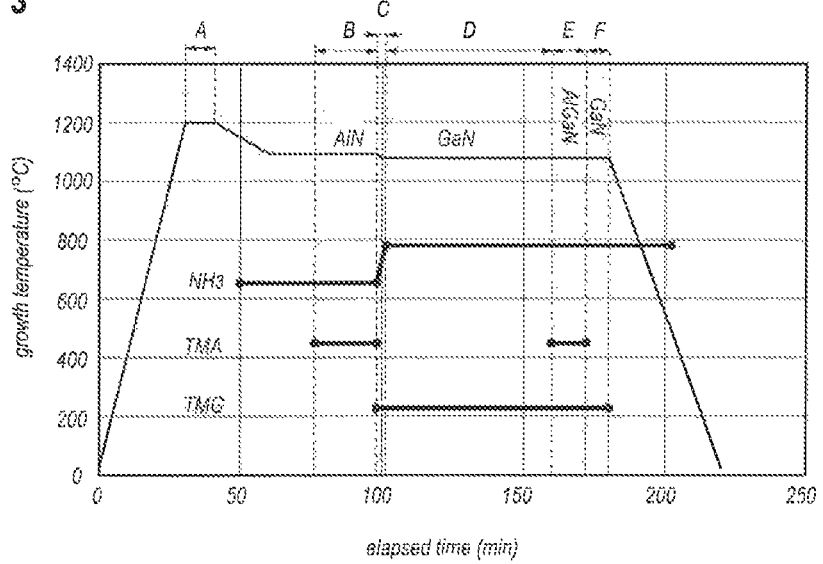
FIG. 3 shows a sequence of a growth temperature of a supply of source gases during the process of growing the epitaxial wafer shown in FIG. 1.

Next, a process of forming the semiconductor device 11 shown in FIG. 2 will be described as referring to FIG. 3 and FIG. 4A to FIG. 4E. FIG. 3, which is comparable with FIG. 10, shows a sequence for growing semiconductor layers according to the present embodiment of the invention, where the horizontal axis corresponds to an elapsed time, while, the vertical axis shows temperatures. FIG. 3 also shows sequences for supplying source gases. FIG. 4A to FIG. 4D show cross sections of the semiconductor device at respective steps for forming the epitaxial wafer, and FIG. 4E shows a cross section of the transistor 11.

The process first sets the substrate 2 in a high temperature in a chamber for epitaxial growth. Specifically, as shown in FIG. 3, the substrate 2 in a temperature thereof is raised to a preset temperature and held under such a preset temperature for a period A. The increase of the temperature may be carried out by a constant rate. The temperature under which the substrate is held is, for instance, 1200° C. Although FIG. 3 shows that no sources, namely, $NH_3$, TMA and TMG, are supplied within the chamber, but the process may supply ammonia ($NH_3$) during the period A.

Figure 4A:
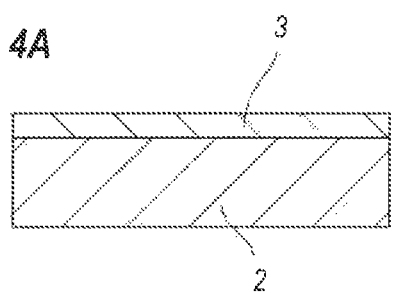
FIG. 4A to FIG. 4E show cross sections of the epitaxial wafer at respective steps of the process.
Figure 4B:
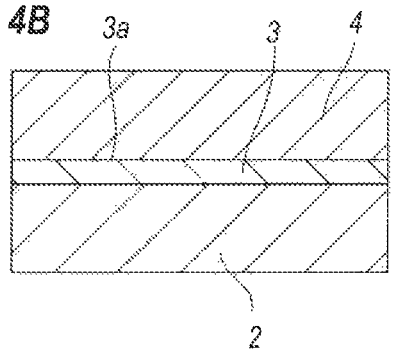

Thereafter, as shown in FIG. 3 and FIG. 4A, at a reduced temperature in the chamber, an AlN layer 3 is grown on the substrate 2 during the period B. The period B supplies sources for Al and N, and sets a pressure within the chamber to the higher than 6.7 kPa but lower than 26.7 kPa. The embodiment sets the pressure to be 13.3 kPa. The growth temperature of the AlN layer 3, which is the first temperature of the present invention, is preferably higher than 1050° C. but lower than 1150° C., where the embodiment sets the first temperature to be 1100° C. The source for aluminum (Al) is tri-methyl-aluminum (TMA); while that for nitrogen (N) is ammonia ($NH_3$), where a flow rate of $NH_3$, which is the first flow rate, is greater than 0.15 mol/min but smaller than 0.45 mol/min, where the embodiment sets the flow rate of $NH_3$ to be 0.43 mol/min; while a flow rate of TMA is set to be 120 µmol/min.

Thereafter, the GaN layer 4 is grown on a surface 3a of the AlN layer 3. Referring to FIG. 3, the process suspends supply of Al source (TMA) and concurrently begins supply of Ga source, which may be tri-methyl-gallium (TMG) by a flow rate of, for instance, 120 µmol/min. Continuing the supply of TMG, the process lowers the temperature in the chamber by a constant rate to a temperature at which the GaN layer 4 is grown, which is the second temperature of the present invention and lower than that for growing the AlN layer 3. A difference between the first temperature for the AlN layer 3 and the second temperature for the GaN layer 5 is at least 20° C. The second temperature for growing the GaN layer 4 is higher than 1000° C. but lower than 1100° C., where the embodiment sets the second temperature to be 1080° C. When the first temperature for the AlN layer 3 is 1100° C., while, the second temperature for the GaN layer 4 is 1080° C., the process lower the temperature within the chamber by 20° C.

Also, the period C continues the supply of $NH_3$ from the period B but gradually increases the flow rate thereof from that for the growth of the AlN layer 3, which is the first flow rate, to the second one for the growth of the GaN layer 4, which is different from the former flow rate. The second flow rate for the growth of the GaN layer 4 may be greater than the first flow rate. The first flow rate for the growth of AlN layer 3 is, for instance, greater than 0.3 mol/min but smaller than 0.6 mol/min, where the embodiment sets the first flow rate to be 0.5 mol/min. The present embodiment thus described sets both the temperature and the flow rate of $NH_3$, but the process may set one of the conditions, namely, the temperature and the flow rate of $NH_3$. Because the period C supplies the sources for Ga (TMG) and for N ($NH_3$), the period C grows the GaN layer 4 from the beginning thereof.

The period C may keep the pressure within the chamber. The period C, that is, a time or period to set the temperature within the chamber and the flow rate of $NH_3$, is longer than 10 seconds but smaller than 600 seconds, where the embodiment sets the period of C to be 60 seconds. FIG. 3 continues the period B to the period C, but the process may insert a blank between the period B and the period C, where only $NH_3$ is supplied but sources of Ga and/or Al are suspended.

Referring to FIG. 3 again, the period D subsequent to the period C grows the GaN layer 4 until the GaN layer 4 has a preset thickness under preset conditions, where the temperature and the flow rate of $NH_3$ are set in those determined during the period C. The growth of the GaN layer 4 is carried under a growth rate of 0.4 nm/sec.

Figure 4C:
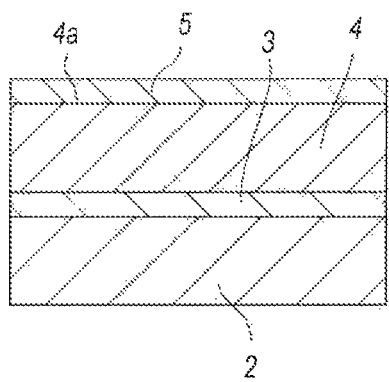
Figure 4D:
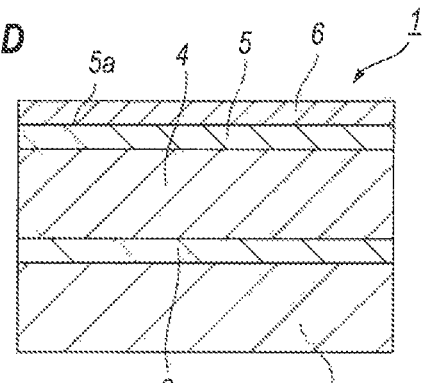
Figure 4E:
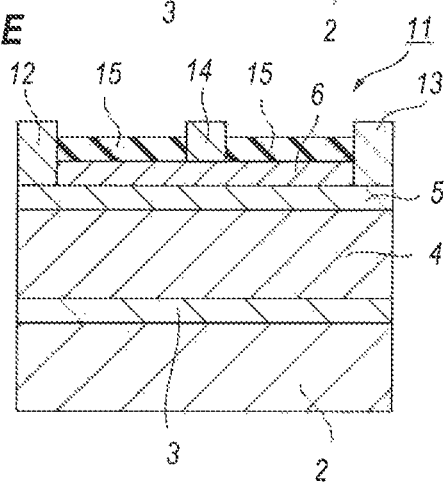

Thereafter, referring to FIG. 3 and FIG. 4C, the process grows the AlGaN barrier layer 5 on the GaN layer 4 during the period E. Supplying TMA, TMG, and $NH_3$ for sources of Al, Ga, and N respectively, the AlGaN layer 5 is grown under the pressure of 13.3 kPa, and the temperature of 1080° C. Thereafter, referring to FIG. 3 and FIG. 4D, the process grows the GaN cap layer 6 onto a surface 5a of the AlGaN barrier layer 5 in the period F after the period E by supplying TMG and $NH_3$ for gallium (Ga) and nitrogen (N) under the temperature of 1080° C. and the pressure of 13.3 kPa. Thus, the process for forming the epitaxial wafer 1 is completed.

Subsequent to the process for preparing the epitaxial wafer 1, steps for forming the semiconductor device may be carried out. Specifically, removing a portion of the cap layer 6 using a patterned mask, the source and the drain electrodes, 12 and 13, may be formed on the surface 5a of the AlGaN barrier layer 5. Also, the gate electrode 14 is formed onto the cap layer 6 between the source and drain electrodes, 12 and 13. Finally, the passivation film 15 covers the electrodes, 12 to 14, and the cap layer 6. Thus, the HEMT 11 according to the present invention may be obtained.

FIG. 5A schematically illustrates structures of the epitaxial wafer formed by the process according to the present invention; FIG. 5B magnifies the interface between the AlN layer 3 and the GaN layer 4; and FIG. 5C further magnifies the interface. The present embodiment grows the GaN layer 4 in an initial portion 41 thereof as continuously varying the growth conditions during the period C. Continuous change of the temperature and the flow rate of $NH_3$ during the period C makes lateral growth in a GaN crystal dominant at an instant, while makes vertical growth thereof dominant at another instant, which means that the growth of the GaN layer 4 may have an instant at which growth characteristics of a GaN layer, in particular, an aspect ratio in the growth rate thereof, may match with surface orientations appearing in the surface of the AlN layer 3. Accordingly, as shown in FIG. 5C, the initial portion 41 of the GaN layer 4 may reduce the defects 23, the dislocations 24, and the impurities 25, or those imperfections disappear during the growth thereof and the puts appearing in the surface of the GaN layer may be reduced.

Figures 6A, 6B, 6C, 6D:
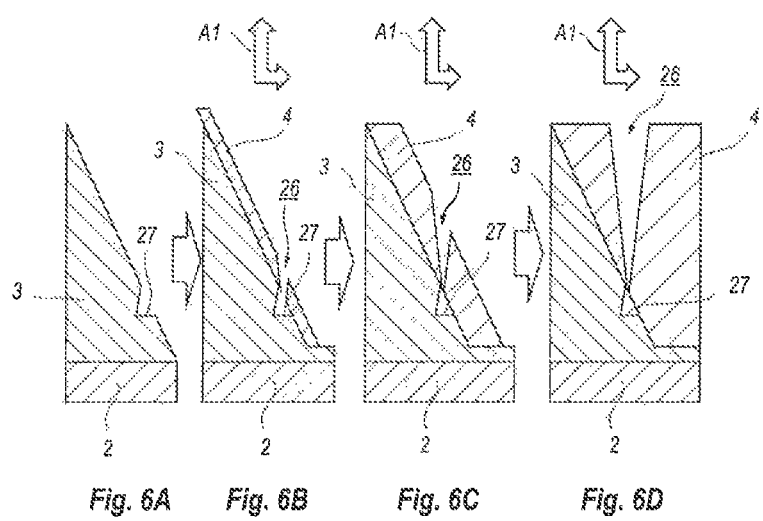
FIG. 6A to FIG. 6D schematically illustrates mechanisms to reduce the surface pits.
Figures 7A, 7B, 7C, 7D:
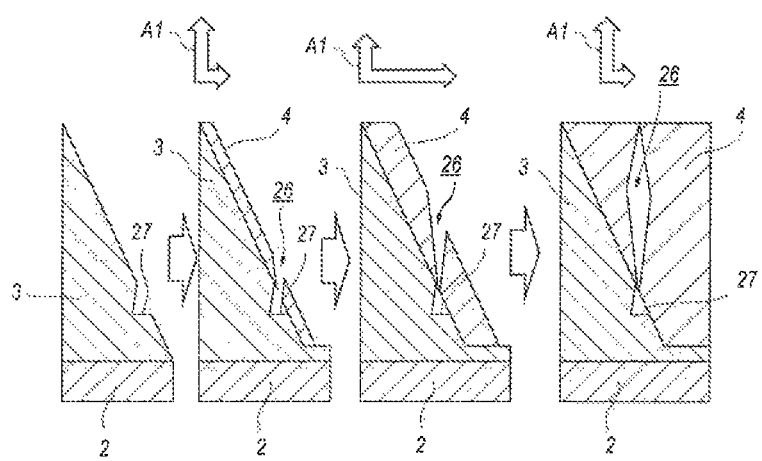
FIG. 7A to FIG. 7D schematically illustrate mechanisms to reduce the surface pits described above.

FIG. 6A to FIG. 6D and FIG. 7A to FIG. 7D schematically illustrate mechanisms to reduce the surface pits described above. Arrows A1 indicate an aspect ratio of growth rates of the GaN layer. When the surface of the AlN layer 3 induces a defect 27 (FIG. 6A), a pit 26 appears on the surface of the GaN layer 4 derived from the defect 27 as shown in FIG. 6B. The pit 26 vertically grows as enlarging sizes thereof as shown FIG. 6C, which results in a surface pit 26 shown in FIG. 6D because the conventional process maintains the aspect ratio in the growth rate thereof. On the other hand, because the aspect ratio in the growth rate of the GaN layer 4 varies during the initial growth thereof, as shown in FIG. 7A and FIG. 7B; the pit 26 may be possibly compensated during the growth of the GaN layer 4. Accordingly, the process of the present embodiment may reduce the pit appearing in the surface of the GaN layer 4.

Figure 8:
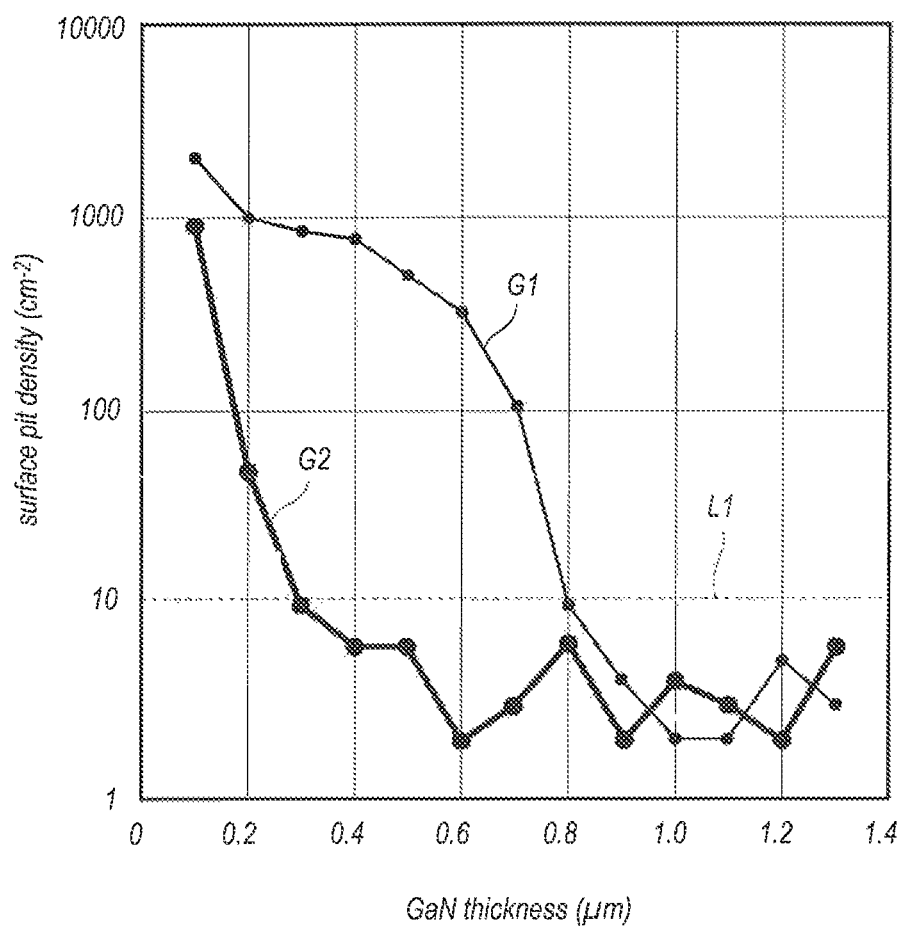
FIG. 8 compares the process of the present embodiment with the conventional process by a relation between the surface pit density in the unit of count/$cm^2$ against the thickness of the GaN layer grown on the AlN layer.

FIG. 8 compares the process of the present embodiment with the conventional one by a relation between the surface pit density in the unit of count/cm$^2$ against the thickness of the GaN layer 4 grown on the AlN layer 3. A behavior G1 is a result by the conventional process, while, another behavior G2 corresponds to the present embodiment, that is, both of the temperature and the flow rate of ammonia (NH$_3$) are varied during the period C. In the conventional process, a GaN layer with a thickness of at least 0.8 µm is necessary to satisfy the surface pit density in a level to secure enough reliability, which is 10 count/cm$^2$ indicated by a dotted line in FIG. 10, as shown in the behavior G1 in FIG. 8. On the other hand, the GaN layer 4 with a thickness at least 0.3 µm may satisfy the surface pit density for securing reliability of the device.

Thus, the process of growing the nitride semiconductor layer according to the present embodiment may reduce the surface pits appearing in the surface of the grown GaN layer 4 even the GaN layer 4 is grown thinner, which means that the total amount of the trap induced within the GaN layer 4 may be also reduced to lower the possibility for carriers to be captured therewith and emitted therefrom; accordingly, the transistor 11 may enhance the pulse response.

The embodiment above described varies both of the temperature and the flow rate of ammonia (NH$_3$) during the period C, but, the process may vary only one of the temperature and the flow rate of ammonia (NH$_3$). Even the sequence to vary one growth condition may show advantages described above. The sequence to vary both conditions, the temperature and the flow rate, shows distinguishable advantages.

The AlN layer 3 may be grown in island structures like the present embodiment, which likely induces defects and/or dislocations in the GaN layer 4 but the surface thereof may be refined. The difference in the growth temperatures between AlN layer 3 and the GaN layer 4 may be at least 20° C. like the present embodiment. Under such a condition, the growth conditions for the GaN layer 4 may be widely varied during the period C, which means that the aspect ratio for the growth of the GaN layer 4 becomes larger and the surface pit density may be effectively reduced.

Modification

Figure 9:
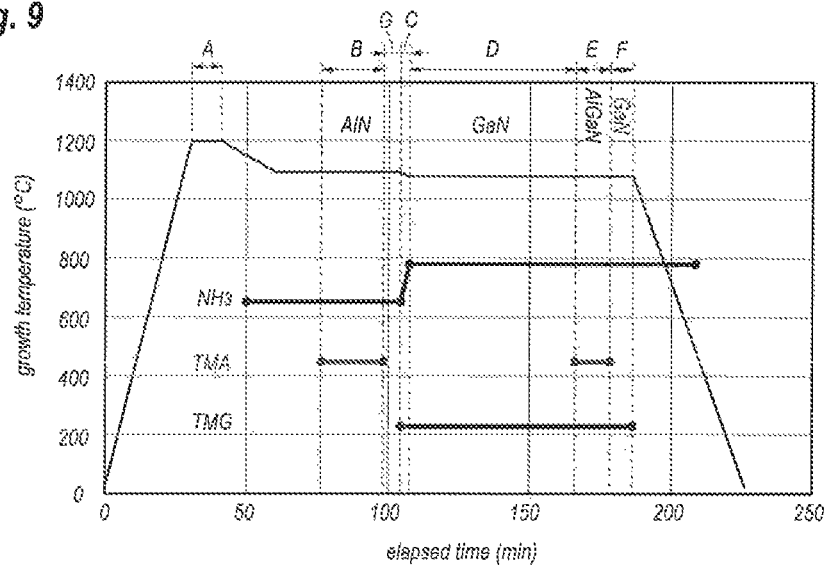
FIG. 9 schematically shows another sequence of a growth temperature and a timing to supply source gases according to a modification of the sequence shown in FIG. 3.

FIG. 9 schematically shows a sequence of a growth temperature and a timing to supply source gases according to a modification of the sequence of the first embodiment shown in FIG. 3. In FIG. 3, the period C for growing the GaN layer 4 also continues from the period B for growing the AlN layer 3 without any intervals therebetween; the modified sequence shown in FIG. 9 provides a period G between the periods, B and C, where the temperature and the flow rate of ammonia (NH$_3$) are maintained in the respective conditions in the period B but the sources for gallium (Ga) and aluminum (Al) are suspended. Even for such a sequence shown in FIG. 9, the advantages appearing in the GaN layer 4 may be obtained.

In the foregoing detailed description, the process for growing the epitaxial layer according to the present invention have been described with reference to specific exemplary embodiments thereof. However, it will be evident for ordinary artisans that further various modifications and changes may be made thereto without departing from the broader spirit and scope of the present invention. For instance, the process changes the temperature and the flow rate of ammonia (NH$_3$) in the period C; but the process may vary other conditions during the period C such as a growth pressure, a flow rate of gallium (Ga) source, and/or a total flow rate of Ga source and NH$_3$. Accordingly, the present specification and figures are accordingly to be regarded as illustrative rather than restrictive.

I claim:

1. A process of forming an epitaxial wafer, comprising steps of:
    growing an aluminum nitride (AlN) layer at a first temperature and a first flow rate of ammonia (NH$_3$); and
    growing a gallium nitride (GaN) layer directly on and continuous with the AlN layer, wherein
    the step of growing the GaN layer includes a first period and a second period,
    in the first period, temperature from the first temperature to a second temperature that is lower than the first temperature, and flow rate of NH$_3$ from the first flow rate to a second flow rate different from the first flow rate are varied,
    in the second period, the GaN layer is grown at the second temperature and the second flow rate of NH$_3$, and
    in the first period and the second period, gallium (Ga) from a gallium source is supplied.

2. The process according to claim 1,
    wherein the step of growing the AlN layer grows the AlN layer in island structures.

3. The process according to claim 1, further including a step of, after the step of growing the AlN layer but before the step of growing the GaN layer, interrupting a supply from an aluminum (Al) source but supplying NH$_3$ at the first flow rate at the first temperature.

4. The process according to claim 1,
    wherein the second flow rate is greater than the first flow rate.

5. The process according to claim 4,
    wherein the first flow rate is 0.15 to 0.45 mol/minute and the second flow rate is 0.3 to 0.6 mol/minute.

6. The process according to claim 1,
    wherein the second temperature is at least 20° C. lower than the first temperature.

7. The process according to claim 5,
    wherein the first temperature is 1050 to 1100° C. and the second temperature is 1000 to 1100° C.

8. The process according to claim 1,
    wherein the first period is 10 to 600 seconds.

9. The process according to claim 1,
    wherein the step of growing the GaN layer grows the GaN layer by a thickness of 100 to 2000 nm.

10. The process according to claim 9,
    wherein the step of growing the GaN layer grows the GaN layer by a thickness of 400 nm.

11. The process according to claim 1,
    wherein the step of growing the AlN layer grows the AlN layer by a thickness of 8 to 50 nm.

12. The process according to claim 11,
    wherein the step of growing the AlN layer grows the AlN layer by a thickness of 20 nm.

13. The process according to claim 1, wherein the first period and the second period maintain a flow rate of the gallium (Ga) source.

* * * * *